(12) United States Patent
Prinz et al.

(10) Patent No.: US 11,834,741 B2
(45) Date of Patent: Dec. 5, 2023

(54) ATOMIC LAYER DEPOSITION WITH PASSIVATION TREATMENT

(71) Applicant: THE BOARD OF TRUSTEES OF THE LELAND STANFORD JUNIOR UNIVERSITY, Stanford, CA (US)

(72) Inventors: Friedrich B. Prinz, Stanford, CA (US); Shicheng Xu, Stanford, CA (US); Timothy English, Stanford, CA (US); John Provine, Stanford, CA (US); Dickson Thian, Stanford, CA (US); Jan Torgersen, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 584 days.

(21) Appl. No.: 16/331,391

(22) PCT Filed: Sep. 7, 2017

(86) PCT No.: PCT/US2017/050542
§ 371 (c)(1),
(2) Date: Mar. 7, 2019

(87) PCT Pub. No.: WO2018/049067
PCT Pub. Date: Mar. 15, 2018

(65) Prior Publication Data
US 2019/0249301 A1 Aug. 15, 2019

Related U.S. Application Data

(60) Provisional application No. 62/385,131, filed on Sep. 8, 2016.

(51) Int. Cl.
C23C 16/455 (2006.01)
C23C 16/18 (2006.01)
(Continued)

(52) U.S. Cl.
CPC ......... *C23C 16/45534* (2013.01); *B01J 23/42* (2013.01); *B01J 35/10* (2013.01);
(Continued)

(58) Field of Classification Search
CPC ........ C23C 16/45534; C23C 16/45553; C23C 16/0245; C23C 16/18; C23C 16/4553;
(Continued)

(56) References Cited

U.S. PATENT DOCUMENTS 4,869,883 A 9/1989 Thorogood et al.
5,561,000 A 10/1996 Dirven et al.
(Continued)

FOREIGN PATENT DOCUMENTS

CN 104916853 A 9/2015
CN 105833889 A 8/2016
(Continued)

OTHER PUBLICATIONS

Clancey et al., "Atomic layer deposition of ultrathin platinum films on tungsten atomic layer deposition adhesion layers: Application to high surface area substrates", J. Vac. Sci. Technol., vol. 33, No. 1, Jan./Feb. 2015(published Dec. 1, 2014), pp. 01A130-1 to 01A130-9.

(Continued)

*Primary Examiner* — Katherine A Bareford
*Assistant Examiner* — Christina D McClure
(74) *Attorney, Agent, or Firm* — Foley & Lardner LLP

(57) ABSTRACT

A method includes: 1) performing an atomic layer deposition cycle including (a) introducing precursors into a deposition chamber housing a substrate to deposit a material on the substrate; and (b) introducing a passivation gas into the deposition chamber to passivate a surface of the material; and 2) repeating 1) a plurality of times to form a film of the material.

7 Claims, 15 Drawing Sheets

(51) Int. Cl.
*B01J 35/10* (2006.01)
*B01J 23/42* (2006.01)
*C23C 16/02* (2006.01)
*B01J 37/34* (2006.01)

(52) U.S. Cl.
CPC .......... *C23C 16/0245* (2013.01); *C23C 16/18* (2013.01); *C23C 16/45553* (2013.01); *B01J 37/349* (2013.01)

(58) Field of Classification Search
CPC .. C23C 16/06; B01J 23/42; B01J 35/10; B01J 37/349
See application file for complete search history.

(56) References Cited

U.S. PATENT DOCUMENTS

| | | | |
|---|---|---|---|
| 6,090,442 | A | 7/2000 | Klaus et al. |
| 6,656,526 | B2 | 12/2003 | Pan |
| 8,796,170 | B2 | 8/2014 | Shirvanian |
| 8,877,655 | B2 | 11/2014 | Shero et al. |
| 2003/0003635 | A1* | 1/2003 | Paranjpe ........... H01L 21/02178 438/149 |
| 2004/0023516 | A1 | 2/2004 | Londergan et al. |
| 2006/0228868 | A1 | 10/2006 | Ahn et al. |
| 2007/0014919 | A1* | 1/2007 | Hamalainen ...... C23C 16/45525 427/248.1 |
| 2007/0099420 | A1* | 5/2007 | Dominguez ...... C23C 16/45525 257/E21.171 |
| 2007/0105008 | A1 | 5/2007 | Gu et al. |
| 2007/0205510 | A1 | 9/2007 | Lavoie et al. |
| 2007/0269982 | A1* | 11/2007 | Rocklein ................. C23C 16/44 438/680 |
| 2008/0241358 | A1 | 10/2008 | Joe et al. |
| 2008/0274282 | A1 | 11/2008 | Bent et al. |
| 2009/0218311 | A1 | 9/2009 | Jiang et al. |
| 2010/0177462 | A1 | 7/2010 | Adzic et al. |
| 2010/0326322 | A1 | 12/2010 | King et al. |
| 2011/0020546 | A1* | 1/2011 | Hamalainen ............ C23C 16/18 427/250 |
| 2011/0139610 | A1* | 6/2011 | Shirvanian .............. H01M 4/92 502/100 |
| 2011/0198756 | A1* | 8/2011 | Thenappan ............. C07F 17/02 257/E21.294 |
| 2011/0207320 | A1 | 8/2011 | Sun et al. |
| 2012/0100301 | A1 | 4/2012 | Kongkanand et al. |
| 2012/0107503 | A1* | 5/2012 | Abelson ................. C23C 16/18 427/248.1 |
| 2012/0276306 | A1 | 11/2012 | Ueda |
| 2013/0126986 | A1 | 5/2013 | Brodsky et al. |
| 2014/0080032 | A1* | 3/2014 | Soboleva ............ H01M 4/8807 429/523 |
| 2014/0193746 | A1 | 7/2014 | Cerri et al. |
| 2014/0255798 | A1 | 9/2014 | Amine et al. |
| 2015/0004529 | A1* | 1/2015 | Donet ................. H01M 4/8867 502/262 |
| 2015/0132683 | A1 | 5/2015 | Shirvanian |
| 2015/0147682 | A1 | 5/2015 | Kuttiyiel et al. |
| 2015/0171433 | A1 | 6/2015 | Kongkanand et al. |
| 2015/0207153 | A1 | 7/2015 | Harkness et al. |
| 2015/0247258 | A1 | 9/2015 | Diankov et al. |
| 2015/0364722 | A1 | 12/2015 | Yang et al. |
| 2016/0148800 | A1 | 5/2016 | Henri et al. |
| 2017/0114458 | A1* | 4/2017 | Xiao ....................... F01N 3/101 |
| 2017/0117556 | A1 | 4/2017 | Kongkanand et al. |

FOREIGN PATENT DOCUMENTS

| | | |
|---|---|---|
| WO | WO-2013/045894 | 4/2013 |
| WO | WO-2013/192056 A1 | 12/2013 |
| WO | WO-2015/189282 A1 | 12/2015 |

OTHER PUBLICATIONS

Esposito et al., "Low-Cost Hydrogen-Evolution Catalysts Based on Monolayer Platinum on Tungsten Monocarbide Substrates", Angew. Chem. Int. Ed., vol. 49, No. 51, Sep. 30, 2010, pp. 9859-9862.

Extended European Search Report on EP Application No. 17849553.7 dated Apr. 16, 2020, 9 pages.

Extended European Search Report on EP Application No. 17849555.2 dated Apr. 21, 2020, 8 pages.

Feng et al., "Subnanometer Palladium Particles Synthesized by Atomic Layer Deposition", ACS Catalysis, vol. 1, No. 6, Apr. 25, 2011, pp. 665-673.

Hsu et al., "Atomic Layer Deposition of Pt on Tungsten Monocarbide (WC) for the Oxygen Reduction Reaction", The Journal of Physical Chemistry C, vol. 115, No. 9, Feb. 14, 2011, pp. 3709-3715.

Lu et al., "Atomic Layer deposition-Sequential self-limiting surface reactions for advanced catalyst 'bottom-up' synthesis", Surface Science Reports, vol. 71, No. 2, Apr. 6, 2016, pp. 410-472.

Yanguas-Gil et al., "Modulation of the Growth Per Cycle in Atomic Layer Deposition Using Reversible Surface Functionalization", Chemistry of Materials, vol. 25, No. 24, Dec. 5, 2013, pp. 4849-4860.

Debe, M.K., et al., "Advanced Cathode Catalysts and Supports for PEM Fuel Cells", 2012 Annual Merit Review, DOE Hydrogen and Fuel Cells and Vehicle Technologies Programs, May 15, 2012, 34 pages.

Brimaud, S., et al., "Electrodeposition of a Pt Monolayer Film: Using Kinetic Limitations for Atomic Layer Epitaxy", J. Am. Chem. Soc., 2013, 135:11716-11719.

Kim, J., et al., "Formation of Single-Layered Pt Islands on Au(111) Using Irreversible Adsorption of Pt and Selective Adsorption of CO to Pt", Langmuir, 2014, 30:4203-4206.

International Search Report and Written Opinion in PCT/US2017/050540, dated Nov. 7, 2017, 11 pages.

International Search Report and Written Opinion in PCT/US2017/050542, dated Nov. 7, 2017, 8 pages.

Foreign Action other than Search Report on CN 201780065747.7 dated Sep. 3, 2021.

Foreign Action other than Search Report on JP 2019-513055 dated Jun. 29, 2021.

Foreign Action other than Search Report on KR 10-2019-7009342 dated Aug. 25, 2021.

Jianbo et al., "Platinum-Coated Gold Nanoporous Film Surface: Electrodeposition and Enhanced Electrocatalytic Activity for Methanol Oxidation," Langmuir, 24, 2008, pp. 5932-5936.

Stoian et al., "Review: Techniques of Preparation of Thin Films: Catalyst Combustion," Catalysts, 11, 1530, 2021, 32 pages.

* cited by examiner

Normal Atomic Layer Deposition

Cycle 1#

*With oxidative precursor*

Cycle 2#

Cycle 3#

| Structure | Reaction enthalpy (eV) |
|---|---|
|  chemisorption on Pt (111) | -2.8 |
|  physisorption on Pt (111) | -0.37 |
|  physisorption on CO adsorbed Pt (111) | -0.059 |

ATOMIC LAYER DEPOSITION WITH PASSIVATION TREATMENT

CROSS-REFERENCE TO RELATED APPLICATION

This application is a national stage entry of International Application No. PCT/US2017/050542, filed Sep. 7, 2017, which claims the benefit of U.S. Provisional Application No. 62/385,131, filed Sep. 8, 2016, the contents of which are incorporated herein by reference in their entirety.

STATEMENT REGARDING FEDERALLY SPONSORED RESEARCH OR DEVELOPMENT

This invention was made with Government support under contract DE-SC0001060 awarded by the Department of Energy. The Government has certain rights in the invention.

BACKGROUND

Atomic layer deposition is a technique used to deposit thin films with high conformality. For various applications, it would be beneficial to reduce a thickness of a deposited film to cover a requisite area of a substrate. For example, for applications ranging from depositing a dielectric layer for a higher capacitance, a solid-state electrolyte with a lower resistance, and a catalyst with a lower active material loading, it would be beneficial to reduce a film thickness down to the level of an atomic monolayer. However, it is a significant challenge to control deposition such that monolayers of materials are uniformly deposited. With conventional atomic layer deposition, a material that is deposited typically will undergo a nucleation phase where nanoparticles will form prior to the nanoparticles joining into a film. During a nucleation phase, a material typically will be preferentially deposited onto an already-deposited material instead of vacant areas on a substrate, and resulting nanoparticles typically will grow to a thickness of several atomic layers prior to joining into a film. Thus, although termed as atomic layer deposition, conventional atomic layer deposition generally does not deposit uniform atomic layers, but rather deposits nanoparticles, which generally does not lead to the formation of an atomic monolayer.

It is against this background that a need arose to develop embodiments of this disclosure.

SUMMARY

In some embodiments, a method includes: 1) performing an atomic layer deposition cycle including (a) introducing precursors into a deposition chamber housing a substrate to deposit a material on the substrate; and (b) introducing a passivation gas into the deposition chamber to passivate a surface of the material; and 2) repeating 1) a plurality of times to form a film of the material.

In some embodiments of the method, the passivation gas adsorbs to the surface of the material.

In some embodiments of the method, the passivation gas is carbon monoxide.

In some embodiments of the method, the passivation gas is ammonia, nitric oxide, or methane.

In some embodiments of the method, the precursors include a first precursor including the material to be deposited, and a second oxidative or reductive precursor.

In some embodiments of the method, the first precursor is an organometallic compound.

In some embodiments of the method, the organometallic compound includes a noble metal.

In some embodiments of the method, the precursors include a first precursor including a first element of the material to be deposited, and a second precursor including a second element of the material to be deposited.

In some embodiments of the method, a surface coverage of the substrate by the film is at least 30%, and the film has an average thickness in a range from 1 atomic layer to 5 atomic layers.

In additional embodiments, a method includes: 1) performing an atomic layer deposition cycle including (a) introducing a first precursor into a deposition chamber housing a substrate such that the first precursor is adsorbed on the substrate; and (b) introducing a passivation precursor into the deposition chamber to react with the first precursor adsorbed on the substrate to yield a material deposited on the substrate, and to passivate a surface of the material; and 2) repeating 1) a plurality of times to form a film of the material.

In some embodiments of the method, the passivation precursor reacts with the first precursor adsorbed on the substrate to yield a passivation moiety adsorbed to the surface of the material.

In some embodiments of the method, the first precursor includes a first element of the material to be deposited, and performing the atomic layer deposition cycle in 1) further includes introducing a second precursor into the deposition chamber such that the second precursor is adsorbed on the substrate, wherein the second precursor includes a second element of the material to be deposited, and the passivation precursor reacts with the first precursor adsorbed on the substrate and the second precursor adsorbed on the substrate to yield the material deposited on the substrate.

In some embodiments of the method, a surface coverage of the substrate by the film is at least 30%, and the film has an average thickness in a range from 1 atomic layer to 5 atomic layers.

In further embodiments, a structure includes a substrate and a film of a material covering the substrate, wherein a surface coverage of the substrate by the film is at least 30%, and the film has an average thickness in a range from 1 atomic layer to 5 atomic layers.

In some embodiments of the structure, the average thickness of the film is in a range from 1 atomic layer to 3 atomic layers.

In some embodiments of the structure, the average thickness of the film is in a range from 1 atomic layer to 2 atomic layers.

In some embodiments of the structure, the film has a surface roughness of no greater than 80% of the average thickness.

In some embodiments of the structure, the material of the film includes a noble metal.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DESCRIPTION

Embodiments of this disclosure are directed to an improved process of atomic layer deposition. The improved process changes the growth behavior of a material during deposition to attain uniform and conformal films down to a thickness of a single atomic layer or a few atomic layers. In some embodiments, the improved process incorporates a passivation treatment to passivate a surface of an already-deposited material to overcome nucleation tendencies that otherwise can lead to the formation of thick nanoparticles. The improved process of some embodiments incorporates the use of a passivation process gas or a passivation precursor to tune or change a surface energy of an already-deposited material such that deposition will self-terminate, and subsequent deposition of a material will be preferential or promoted towards covering vacant areas of a substrate instead of the already-deposited material.

Figure 1:
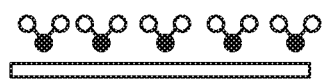
FIG. 1. Schematic process flow of atomic layer deposition without passivation treatment.
Figure 1:
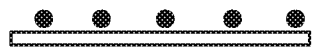
Figure 1:
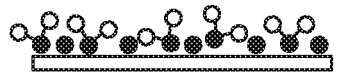
Figure 1:
Figure 1:
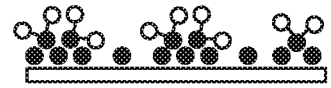
Figure 1:

By way of illustrating a contrast with the improved process, FIG. 1 is a schematic process flow of atomic layer deposition without passivation treatment (referred to as normal atomic layer deposition). FIG. 1 illustrates normal atomic layer deposition of a single element material, for example, a single element metal. The process flow of normal atomic layer deposition includes performing a first atomic layer deposition cycle to deposit the material on a substrate held or housed within a deposition chamber, followed by performing a second atomic layer deposition cycle to deposit the material on the substrate, followed by performing a third atomic layer deposition cycle to deposit the material on the substrate, and so on until a requisite amount of the material is deposited.

Referring to FIG. 1, performing each atomic layer deposition cycle includes sequentially exposing the substrate, or a portion of the substrate, to deposition gases of chemical precursors or reactants including a first precursor containing the material to be deposited, and a second oxidative precursor. In the case of a single element metal, for example, the first precursor can be a metal-containing precursor such as an organometallic compound with a metal coordinated with organic ligands, and the second oxidative precursor can be oxygen, ozone, or oxygen plasma. During the first atomic layer deposition cycle, the first precursor is introduced into the chamber to result in the first precursor being adsorbed to the substrate, in the form of molecules of the first precursor, residues of the molecules of the first precursor, or a combination of both, and the second oxidative precursor is introduced into the chamber to result in a reaction between the adsorbed first precursor and the second oxidative precursor to liberate ligands included in the adsorbed first precursor, thereby leaving the material deposited on the substrate. A removal operation can be performed subsequent to introducing each precursor to remove reaction products and any unreacted precursor, such as by evacuation or purging with an inert carrier gas. During subsequent atomic layer deposition cycles, introducing the first precursor results in the first precursor being preferentially adsorbed adjacent to or onto the already-deposited material as a result of a more favorable adsorption energy relative to the substrate, and introducing the second oxidative precursor liberates ligands included in the adsorbed first precursor, resulting in subsequent material being deposited adjacent to or onto the already-deposited material. As a result, normal atomic layer deposition leads to non-uniform deposition of the material to form nanoparticles spaced apart by vacant areas of the substrate, and the nanoparticles grow to a thickness of several atomic layers prior to joining into a film. During a nucleation phase of normal atomic layer deposition, the formation of nanoparticles results in the deposited material having a high surface roughness due to a high variability in thickness of the deposited material. Although the surface roughness can be reduced with further deposition cycles and merging of nanoparticles into a film, the resulting film becomes undesirably thick.

Figure 2A:
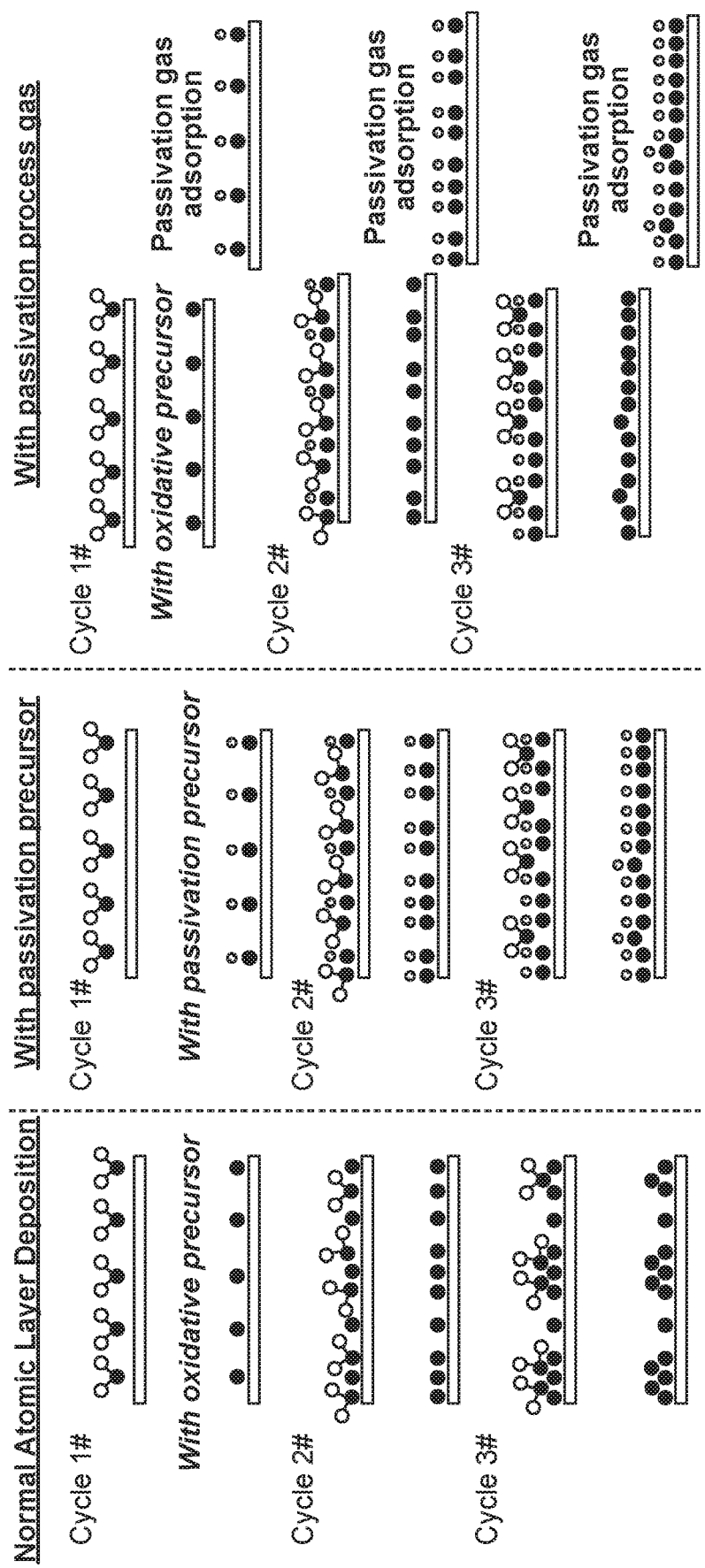
FIG. 2A. Schematic process flow of normal atomic layer deposition in a left panel, atomic layer deposition incorporating the use of a passivation precursor in a middle panel, and atomic layer deposition incorporating the use of a passivation process gas in a right panel.

FIG. 2A is a schematic process flow of atomic layer deposition with passivation treatment, with normal atomic layer deposition in a left panel, with the use of a passivation precursor in a middle panel, and with the use of a passivation gas in a right panel. FIG. 2A illustrates deposition of a single element material, for example, a single element metal, although deposition of a binary element material, a ternary element material, or other multi-element material is also encompassed by this disclosure and is further explained below. The process flow of passivation-incorporated atomic layer deposition includes performing a first atomic layer deposition cycle to deposit the material on a substrate held within a deposition chamber, followed by performing a second atomic layer deposition cycle to deposit the material on the substrate, followed by performing a third atomic layer deposition cycle to deposit the material on the substrate, and so on until a requisite amount of the material is deposited. A number of deposition cycles can be, for example, in a range from 1 to 5000, from 2 to 4000, from 3 to 3000, from 5 to 2000, or from 10 to 1000.

Referring to the process flow of passivation-incorporated atomic layer deposition in the right panel of FIG. 2A, performing each atomic layer deposition cycle includes sequentially exposing the substrate, or a portion of the substrate, to deposition gases including a first precursor containing the material to be deposited, a second oxidative precursor, and a passivation gas. In the case of a single element metal, for example, the first precursor can be a metal-containing precursor such as an organometallic compound with a metal coordinated with organic ligands, and the second oxidative precursor can be oxygen, ozone, or oxygen plasma. For example, for the specific case of platinum (Pt), the first precursor can be (methyl cyclopentadienyl)trimethylplatinum or another Pt-containing organometallic compound. In addition to Pt, deposition can be performed for other noble metals, such as ruthenium (Ru), rhodium (Rh), palladium (Pd), silver (Ag), osmium (Os), iridium (Ir), and gold (Au), as well as other single element metals, such as nickel (Ni) and cobalt (Co). During the first atomic layer deposition cycle, the first precursor is introduced into the chamber to result in the first precursor being adsorbed to the substrate, in the form of molecules of the first precursor, residues of the molecules of the first precursor, or a combination of both, and the second oxidative precursor is introduced into the chamber to result in a reaction between the adsorbed first precursor and the second oxidative precursor to liberate ligands included in the adsorbed first precursor, thereby leaving the material deposited on the substrate. A second reductive precursor, such as hydrogen or hydrogen plasma, can be used in place of, or in combination with, the second oxidative precursor. A removal operation can be performed subsequent to introducing each precursor to remove reaction products and any unreacted precursor, such as by evacuation or purging with an inert carrier gas.

Unlike normal atomic layer deposition, the passivation gas is introduced into the chamber subsequent to introducing precursors in each atomic layer deposition cycle, including the first atomic layer deposition cycle, and prior to introducing precursors in a subsequent atomic layer deposition cycle. The passivation gas serves to tune or change an adsorption energy between the first precursor and the already-deposited material to render that adsorption energy less favorable such that subsequent adsorption of the first precursor will be preferential or promoted towards covering vacant areas of the substrate instead of the already-deposited material. In such manner, the use of the passivation gas enhances dispersion of the first precursor along the substrate and leads to enhanced and more uniform coverage of deposited material along the substrate, as well as allowing control over that coverage. In some embodiments, criteria for the passivation gas include one or more of the following: 1) ability to adsorb onto the deposited material; 2) exhibits greater tendency towards or has a stronger adsorption onto the deposited material compared to the substrate; 3) after adsorption onto the deposited material, the passivation gas forms an intermediate chemical species; and 4) an adsorption energy of the first precursor to the intermediate species is greater than (e.g., less negative or more positive than) about −10 kJ/mol (or greater than about −0.104 eV), such as about −5 kJ/mol or greater (or about −0.052 eV or greater), about 0 kJ/mol or greater (or about 0 eV or greater), or about 10 kJ/mol or greater (or about 0.104 eV or greater), or the adsorption energy of the first precursor to the intermediate species is greater than an adsorption energy of the first precursor to the substrate. For example, for the case of Pt or another single element metal, the passivation gas can be carbon monoxide (CO). In addition to CO, other passivation gases satisfying the above-noted criteria can be used, such as ammonia ($NH_3$), nitric oxide (NO), and methane ($CH_4$). A process temperature can be controlled to mitigate against desorption of the passivation gas. For example, for the case of CO or another passivation gas, a temperature of the substrate can be controlled to be in a range from about 50° C. to about 250° C., from about 80° C. to about 200° C., or from about 100° C. to about 150° C.

Referring next to the process flow of passivation-incorporated atomic layer deposition in the middle panel of FIG. 2A, performing each atomic layer deposition cycle includes sequentially exposing the substrate, or a portion of the substrate, to deposition gases including a first precursor containing the material to be deposited, and a second passivation precursor. Certain aspects of the process flow in the middle panel can be similarly performed as explained above for the right panel, and those aspects are not repeated. Here, the passivation precursor serves dual functions of reacting with the first precursor adsorbed to the substrate to liberate ligands included in the adsorbed first precursor, and tuning or changing an adsorption energy between the first precursor and the already-deposited material to render that adsorption energy less favorable such that subsequent adsorption of the first precursor will be preferential or promoted towards covering vacant areas of the substrate instead of the already-deposited material. In such manner, the use of the passivation precursor enhances dispersion of the first precursor along the substrate and leads to enhanced and more uniform coverage of deposited material along the substrate, as well as allowing control over that coverage. In some embodiments, criteria for the passivation precursor include one or more of the following: 1) ability to react with the first precursor to form an intermediate chemical species; and 2) an adsorption energy of the first precursor to the intermediate species is greater than (e.g., less negative or more positive than) about −10 kJ/mol (or greater than about −0.104 eV), such as about −5 kJ/mol or greater (or about −0.052 eV or greater), about 0 kJ/mol or greater (or about 0 eV or greater), or about 10 kJ/mol or greater (or about 0.104 eV or greater), or the adsorption energy of the first precursor gas to the intermediate species is greater than an adsorption energy of the first precursor gas to the substrate. In some embodiments, the passivation precursor includes a passivation ligand or another passivation chemical moiety that remains adsorbed on the first precursor, subsequent to reaction of the passivation precursor with the first precursor. For example, the passivation moiety can have a chemical structure corresponding to, or similar to, that of a passivation gas explained above.

Figure 2B:
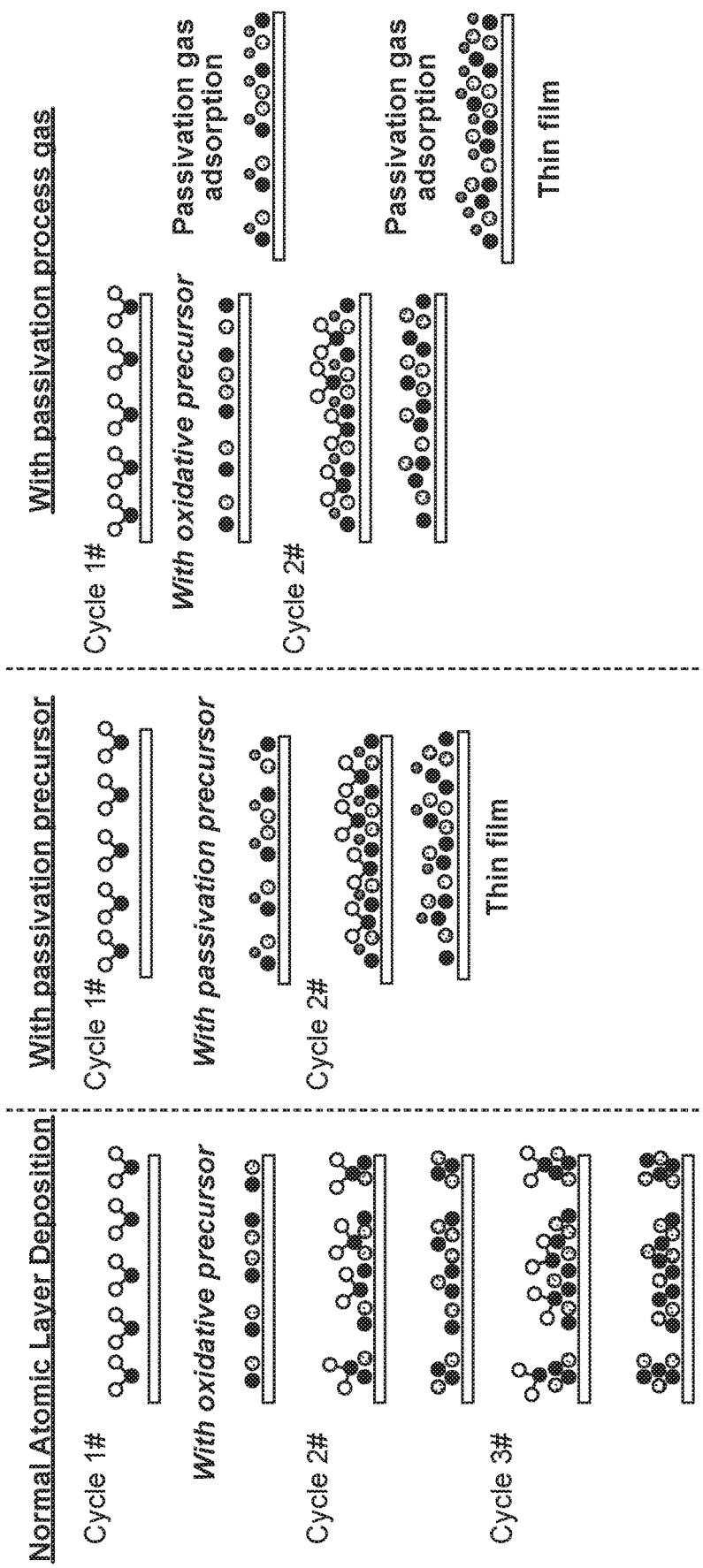
FIG. 2B. Schematic process flow of normal atomic layer deposition in a left panel, atomic layer deposition incorporating the use of a passivation precursor in a middle panel, and atomic layer deposition incorporating the use of a passivation process gas in a right panel.

In addition to deposition of a single element material explained above, passivation-incorporated atomic layer deposition also can be applied for deposition of multi-element materials. FIG. 2B is a schematic process flow of atomic layer deposition with passivation treatment, with normal atomic layer deposition in a left panel, with the use of a passivation precursor in a middle panel, and with the use of a passivation gas in a right panel. FIG. 2B illustrates deposition of a binary element material by way of example, although deposition of a ternary element material or other multi-element material is also encompassed by this disclosure. The process flow of normal atomic layer deposition and passivation-incorporated atomic layer deposition includes performing a first atomic layer deposition cycle to deposit the material on a substrate held within a deposition chamber, followed by performing a second atomic layer deposition cycle to deposit the material on the substrate, followed by performing a third atomic layer deposition cycle to deposit the material on the substrate, and so on until a requisite amount of the material is deposited. Certain aspects of the process flow in FIG. 2B can be similarly performed as explained above for FIG. 2A, and those aspects are not repeated.

Referring to the process flow of passivation-incorporated atomic layer deposition in the right panel of FIG. 2B, performing each atomic layer deposition cycle includes sequentially exposing the substrate, or a portion of the substrate, to deposition gases including a first precursor containing a first element of the material to be deposited, a second precursor containing a second element of the material to be deposited, and a third oxidative precursor. In the case of a binary element metal, for example, the first precursor and the second precursor can be different metal-containing precursors, such as different organometallic compounds with respective metals coordinated with organic ligands. During the first atomic layer deposition cycle, the first precursor is introduced into the chamber to result in the first precursor being adsorbed to the substrate, the second precursor is introduced into the chamber to result in the second precursor being adsorbed to the substrate, and the third oxidative precursor is introduced into the chamber to result in a reaction between the adsorbed first precursor, the adsorbed second precursor, and the third oxidative precursor to liberate ligands included in the adsorbed first precursor and the adsorbed second precursor, thereby leaving the material deposited on the substrate. A third reductive precursor, such as hydrogen or hydrogen plasma, can be used in place of, or in combination with, the third oxidative precursor. Also, the second precursor can perform an oxidative or a reductive function with respect to the first precursor, such that a separate oxidative or reductive precursor can be omitted. A removal operation can be performed subsequent to introducing each precursor to remove reaction products and any unreacted precursor, such as by evacuation or purging with an inert carrier gas.

Unlike normal atomic layer deposition, a passivation gas is introduced into the chamber subsequent to introducing precursors in each atomic layer deposition cycle, and prior to introducing precursors in a subsequent atomic layer deposition cycle. The passivation gas serves to tune or change adsorption energies between the first precursor and the already-deposited material and between the second precursor and the already-deposited material to render those adsorption energies less favorable such that subsequent adsorption of the first precursor and the second precursor will be preferential or promoted towards covering vacant areas of the substrate instead of the already-deposited material. In such manner, the use of the passivation gas enhances dispersion of the first precursor and the second precursor along the substrate and leads to enhanced and more uniform coverage of deposited material along the substrate, as well as allowing control over that coverage. It is also contemplated that two or more different passivation gases can be used, such as a first passivation gas that preferentially adsorbs onto the first element of the deposited material to tune or change an adsorption energy with respect to the first element, and a second passivation gas that preferentially adsorbs onto the second element of the deposited material to tune or change an adsorption energy with respect to the second element.

Referring next to the process flow of passivation-incorporated atomic layer deposition in the middle panel of FIG. 2B, performing each atomic layer deposition cycle includes sequentially exposing the substrate, or a portion of the substrate, to deposition gases including a first precursor containing a first element of the material to be deposited, a second precursor containing a second element of the material to be deposited, and a third passivation precursor. Here, the passivation precursor serves dual functions of reacting with the first precursor and the second precursor adsorbed to the substrate to liberate ligands included in the adsorbed first precursor and the adsorbed second precursor, and tuning or changing adsorption energies between the first precursor and the already-deposited material and between the second precursor and the already-deposited material to render those adsorption energies less favorable such that subsequent adsorption of the first precursor and the second precursor will be preferential or promoted towards covering vacant areas of the substrate instead of the already-deposited material. In such manner, the use of the passivation precursor enhances dispersion of the first precursor and the second precursor along the substrate and leads to enhanced and more uniform coverage of deposited material along the substrate, as well as allowing control over that coverage. It is also contemplated that two or more different passivation precursors can be used, such as a first passivation precursor that preferentially reacts with the first precursor adsorbed to the substrate to tune or change an adsorption energy with respect to the first element, and a second passivation precursor that preferentially reacts with the second precursor adsorbed to the substrate to tune or change an adsorption energy with respect to the second element.

Figure 3:
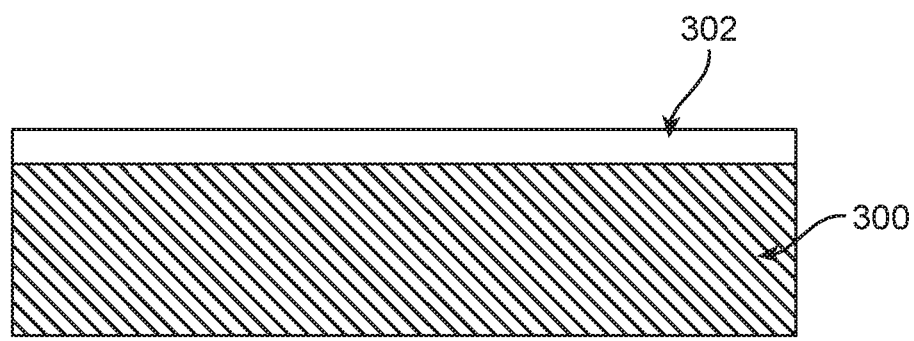
FIG. 3. Schematic illustration of a structure of a substrate and a thin film of a material covering the substrate.

Compared to normal atomic layer deposition, the passivation-incorporated atomic layer deposition illustrated in FIGS. 2 and 3 allows greater control over deposition to attain enhanced coverage of a deposited material with a reduced thickness down to a single atomic layer or a few atomic layers. By incorporating a passivation treatment, the process flow provides self-limiting atomic monolayer (or near atomic monolayer) deposition of a material, and overcomes nucleation tendencies that otherwise can restrict a minimum thickness (typically several atomic layers) for requisite coverage of a substrate. Further, the passivation-incorporated process flow still retains the benefits of atomic layer deposition, including a self-saturation nature for greater thickness control and an ability to deposit a material on a three-dimensional substrate with a high surface area.

FIG. 3 is a schematic illustration of a structure of a substrate 300 and a thin film 302 of a material covering the substrate 300, where the thin film 302 is formed by passivation-incorporated atomic layer deposition. In some embodiments, the resulting thin film 302 provides a surface coverage of the substrate 300 of at least about 5% (e.g., relative to an area of the substrate 300 of at least about 100 $nm^2$, at least about 400 $nm^2$, at least about 2,500 $nm^2$, at least about 10,000 $nm^2$, or at least about 250,000 $nm^2$), such as at least about 10%, at least about 15%, at least about 20%, at least about 30%, at least about 40%, at least about 50%, at least about 60%, at least about 70%, at least about 80%, at least about 90%, at least about 95%, or at least about 98%, with an average thickness in a range from about 1 atomic layer to about 5 atomic layers, from about 1 atomic layer to about 4 atomic layers, from about 1 atomic layer to about 3 atomic layers, from about 1 atomic layer to about 2 atomic layers, or from about 1 atomic layer to about 1.5 atomic layers, and with a surface roughness (root mean square) of no greater than about 80% of the average thickness, such as no greater than about 70%, no greater than about 60%, no greater than about 50%, no greater than about 40%, no greater than about 30%, no greater than about 20%, no greater than about 15%, or no greater than about 10%. Surface coverage of the thin film 302 can be assessed using imaging techniques, such as using transmission electron microscopy (TEM) or scanning electron microscopy (TEM) images, backscattering spectroscopy, X-ray photoelectron spectroscopy (XPS), or inductively coupled plasma mass spectrometry (ICP-MS). In the case of a single element material, 1 atomic layer can correspond to a thickness of a single layer of atoms of the element. In the case of a binary element material having a molar composition of a % of a first element and b % of a second element, 1 atomic layer can correspond to a thickness of a single layer of atoms having an effective size given by (a/100)×(size of an atom of the first element)+(b/100)×(size of an atom of the second element). A similar weighted average according to a molar composition can be used to specify a thickness of 1 atomic layer for a ternary element material or other multi-element material.

In some embodiments, the resulting thin film 302 has an area of at least about 50 $nm^2$, such as at least about 100 $nm^2$, at least about 400 $nm^2$, at least about 2,500 $nm^2$, at least about 10,000 $nm^2$, or at least about 250,000 $nm^2$, with an average thickness in a range from about 1 atomic layer to about 5 atomic layers, from about 1 atomic layer to about 4 atomic layers, from about 1 atomic layer to about 3 atomic layers, from about 1 atomic layer to about 2 atomic layers, or from about 1 atomic layer to about 1.5 atomic layers, and with a surface roughness (root mean square) of no greater than about 80% of the average thickness, such as no greater than about 70%, no greater than about 60%, no greater than about 50%, no greater than about 40%, no greater than about 30%, no greater than about 20%, no greater than about 15%, or no greater than about 10%.

Various applications can benefit from the passivation-incorporated atomic layer deposition disclosed herein. Examples include:

1) Applications where it is desired to reduce an active material loading, such as for the case of depositing catalysts (e.g., metals, metal alloys, and compounds), where a reduction in thickness along with enhanced uniformity in thickness can translate into a higher mass activity with greater exposure of catalytic surface atoms in an ultra-thin film;

2) Applications where a thinner deposited material is desired, such as for the case of depositing an ultra-thin dielectric layer for a higher capacitance of a device, for the case of depositing an ultra-thin, solid-state electrolyte for an ion conductor with a lower resistance in electrochemical cells (e.g., fuel cells, photoelectrochemical cells, and dye sensitized solar cells), and for the case of depositing an ultra-thin electrode for devices such as transistors and batteries; and 3) Applications where atomic layer-thick materials show unusual properties different from properties in a bulk form.

EXAMPLES

The following examples describe specific aspects of some embodiments of this disclosure to illustrate and provide a description for those of ordinary skill in the art. The examples should not be construed as limiting this disclosure, as the examples merely provide specific methodology useful in understanding and practicing some embodiments of this disclosure.

Example 1

Experimental

Atomic layer deposition (ALD) of platinum (Pt) can be achieved by alternately exposing a platinum-containing precursor and an oxidative precursor (or an oxidant) to target substrates. When using oxygen as the oxidant, the process temperature should be above about 220° C., while lower temperature deposition can be achieved by using ozone or oxygen plasma. The selected passivation gas, for this example, is carbon monoxide (about 99.5%, Praxair). Considering the desorption thermodynamics of carbon monoxide, a substrate temperature was varied from 100° C. to 150° C. to mitigate against desorption of carbon monoxide, and thus oxygen plasma or ozone was used. ALD with oxygen plasma as the oxidant was investigated in a Fiji reactor (Ultratech/Cambridge Nanotech) with a remote plasma generator. A typical oxygen plasma mixture includes about 200 standard cubic centimeters per minute (sccm) of argon and about 30 sccm of oxygen. ALD with ozone as the oxidant was investigated in a customized ALD system. Ozone is generated from a mixture of oxygen (about 99.99%) and nitrogen (about 99.998%, with mixing concentration of about 50 parts per million (ppm)) in an ozone generator (MKS Instrument, AX8407-C2). The feeding oxygen flow rate is kept at about 500 sccm, providing an ozone concentration of about 21.7 wt. %. The Pt-containing precursor is (methyl cyclopentadienyl)trimethylplatinum (about 99%, Strem Chemicals) and is heated at about 80° C. To assure the metallic form of deposited Pt, hydrogen (about 99.999%, Praxair) is introduced after the oxidation stage. A typical ALD cycle without passivation gas involves a Pt-containing precursor pulse, an oxidant pulse (oxygen plasma or ozone), and a hydrogen pulse (hydrogen or hydrogen plasma), each followed by a carrier gas purge. To achieve higher surface coverage with reduced film thickness, carbon monoxide pulse is added at the end of the typical ALD cycle. This pulse can be either with or without a pump isolated from a chamber when the substrate can be soaked in a process gas. A typical treatment exposes the substrate to carbon monoxide at about 1-5 Torr for about 5-30 seconds, followed by a carrier gas purge to remove undesired adsorbed gaseous species. Longer exposure to higher pressure passivation gas can increase the likelihood of carbon monoxide adsorbed to a surface of deposited Pt, which provides a mechanism to adjust a resulting film morphology.

Results

Figure 4:
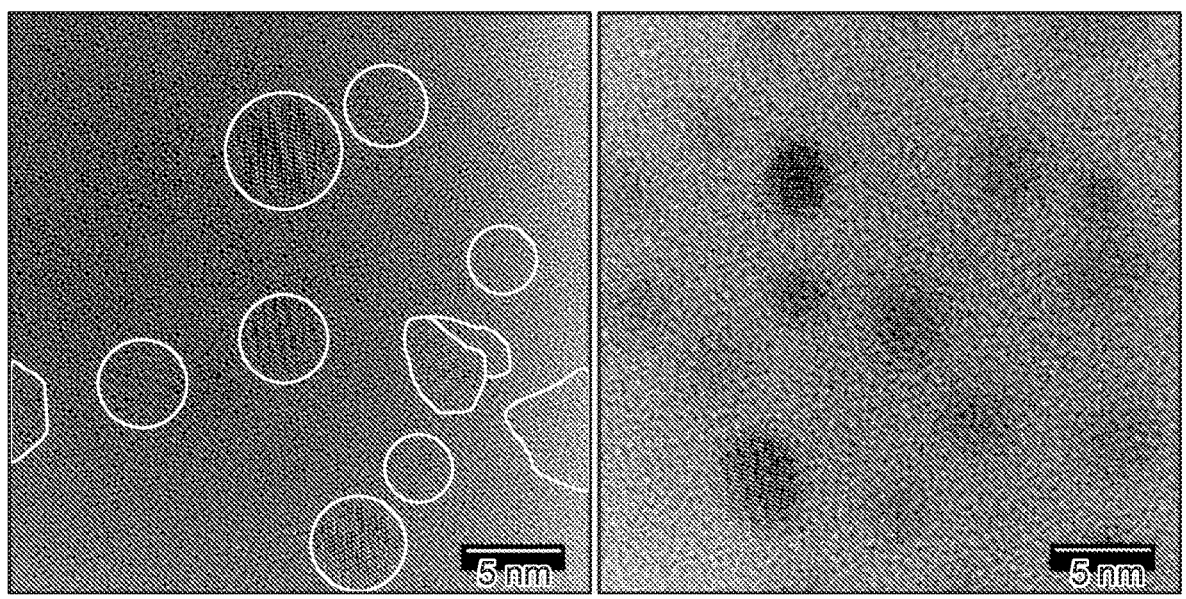
FIG. 4. Transmission electron microscopy (TEM) images after 50 atomic layer deposition cycles of platinum (Pt) deposition on alumina substrates with oxygen plasma as oxidant at about 150° C. with (left) and without (right) carbon monoxide passivation treatment. Circles on the left panel highlight Pt islands.

FIG. 4 presents morphologies of Pt nanoislands formed with a passivation-incorporated process and a process without passivation in the left and right transmission electron microscopy (TEM) images, respectively. The substrate, ALD-deposited alumina, has an amorphous structure and constitutes the background of the images. The contrast of Pt nanocrystal areas compared to the background can reflect thicknesses of the nanoislands. Due to nucleation delays, 50 ALD cycles of Pt does not yet form a complete film. Both processes result in nanoisland formation, where the Pt nanocrystal areas in the left image are significantly thinner compared to the ones in the right image. Due to greater thickness/shape variations, a greater proportion of nanoislands in the right image are out-of-focus with just a few that are in-focus, which also indicate that the Pt nanocrystals in the left image are thinner and more uniform in thickness than the ones in the right image. In the process without passivation treatment, there is a close competition between adsorption of Pt-containing precursor gas on vacant areas of the substrate and on already-deposited Pt areas. As a result, with increased surface coverage of Pt nanoislands, the nanoislands are also growing thicker and wider. In contrast, the passivation gas renders the Pt-containing precursor less likely to adsorb on the already-deposited Pt nanoislands. The nanoislands grow wider as nucleation sites increase with ALD cycles, but do not grow as thick compared to the process without passivation treatment. As shown in FIG. 4, the surface coverage of Pt in the left image is about 12.9% while the surface coverage of Pt in the right image is about 13.7%. Due to the self-saturation nature of the ALD processes, the surface coverage of Pt nanoislands is a function of the number of ALD cycles, which relate to the likelihood of the Pt-containing precursor being adsorbed on a surface. The passivation gas reduces the likelihood of Pt being deposited on exposed Pt surfaces, and thus controls the thickness of the Pt nanoislands.

Figure 5:
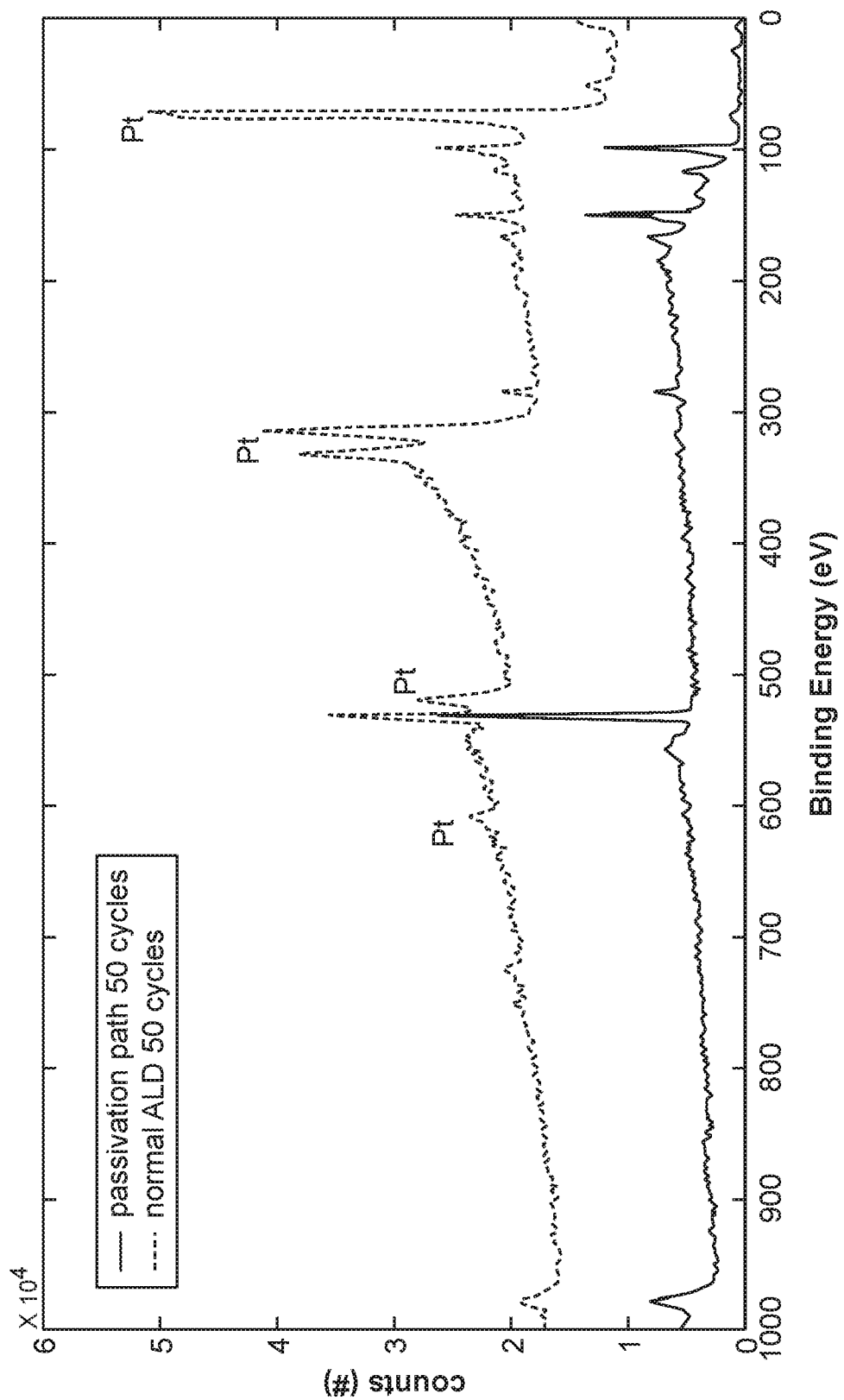
FIG. 5. X-ray photoelectron spectroscopy (XPS) profiles after 50 atomic layer deposition cycles of Pt deposition on silicon substrates with oxygen plasma as oxidant at about 150° C. with (lower curve) and without (upper curve) carbon monoxide passivation treatment.

FIG. 5 presents X-ray photoelectron spectroscopy (XPS) profiles after 50 ALD cycles of Pt deposition without passivation treatment and with passivation treatment on silicon substrates with native oxides. The deposition result is similar to that on alumina substrate given the similar adsorption behavior of Pt-containing precursors and carbon monoxide on the oxide surfaces. With a large contrast in the peak intensities of Pt 4 f peaks (region of about 70-75 eV), it is evident that the amount of Pt deposited using the process without passivation treatment is significantly greater than that with passivation treatment.

Figure 6:
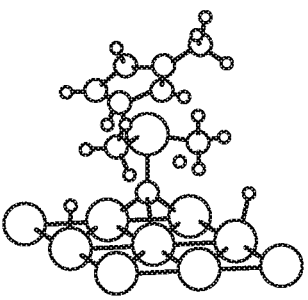
FIG. 6. Adsorption energies of Pt-containing precursor on Pt and carbon monoxide-adsorbed Pt from density function theory (DFT) calculations.
Figure 6:
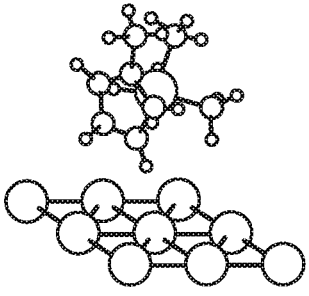
Figure 6:
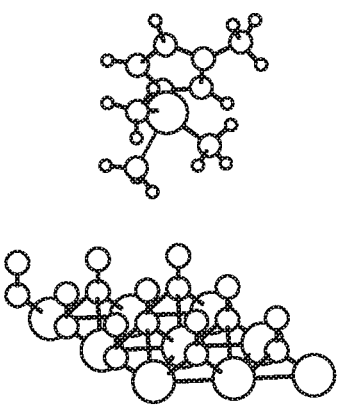
Figure 7:
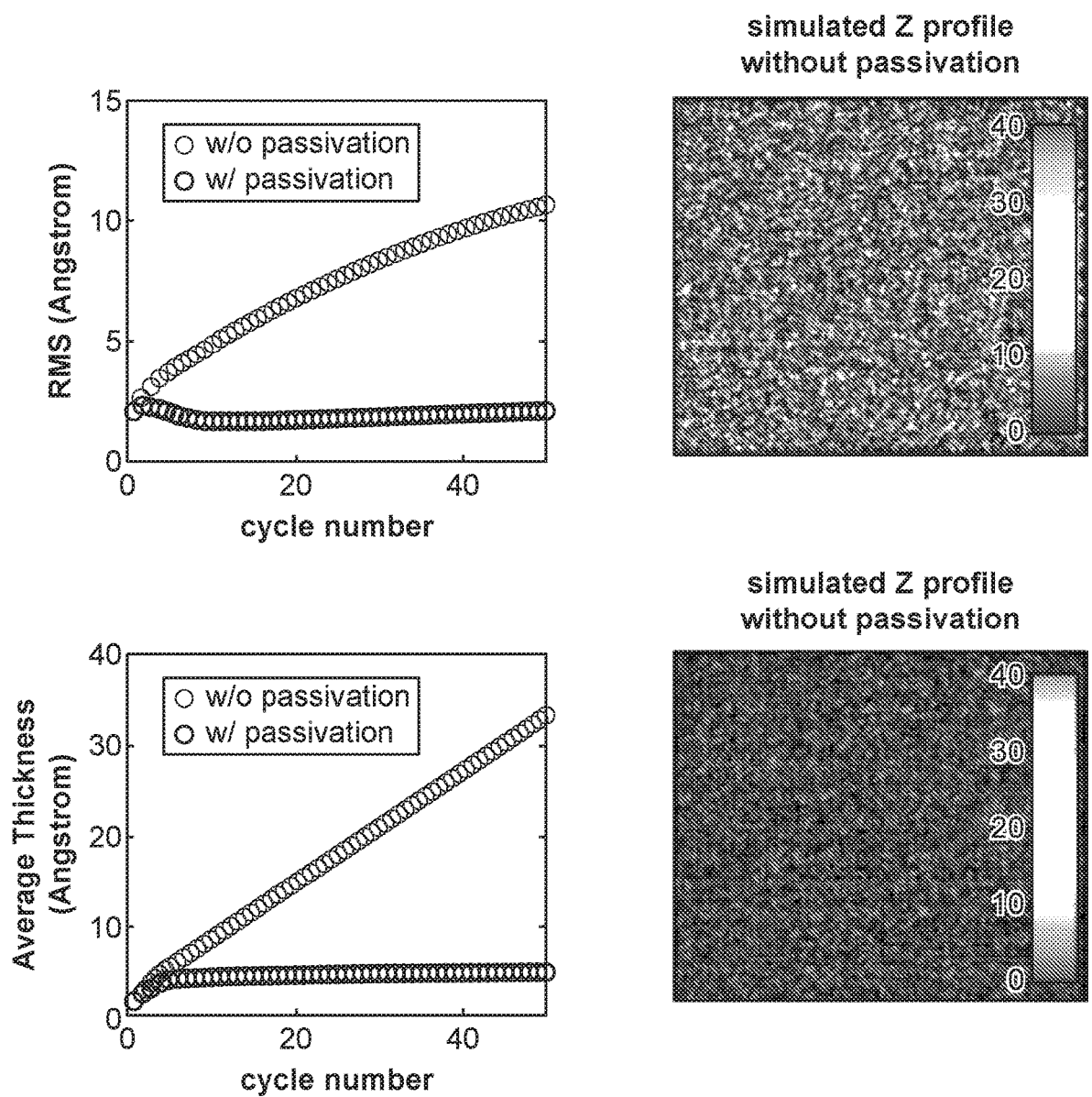
FIG. 7. Simulated atomic layer deposition process with and without passivation treatment. The contour plots on the right represent height profiles of simulated films.

It is evident that the deposition rate of Pt using the passivation-incorporated process is slower compared to that without passivation treatment. The TEM analysis indicates that the slower growth is a result of thinner film/nanoisland formation with a similar surface coverage retained. To theoretically explain the observed phenomena, density function theory (DFT) is used to calculate chemisorption and physisorption energies, which are listed in FIG. 6. Pt (111) is the preferentially exposed facet in ALD deposited Pt films. The Pt-containing precursor, (methyl cyclopentadienyl)trimethylplatinum, can be physisorbed or chemisorbed on catalytically active Pt (111) surfaces. Both adsorption routes are likely to be thermally favorable, as indicated by the significantly negative reaction enthalpies calculated by DFT. In contrast, the adsorption between carbon monoxide-adsorbed Pt (111) and the Pt-containing precursor is not as favorable. This increases the likelihood of the Pt-containing precursor being adsorbed onto vacant areas of the substrate without Pt and improves the dispersion of Pt over the substrate. FIG. 7 presents simulated ALD processes with and without passivation treatment using calculated thermodynamic values. The growth rate and film roughness of Pt resulting from the process with passivation treatment can be significantly smaller than that without passivation treatment. Nevertheless, given the finite adsorption energy between the carbon monoxide-adsorbed Pt and the Pt-containing precursor, there is some likelihood that the Pt-containing precursor will be adsorbed onto already-deposited Pt to cause some local roughness.

Example 2

Figure 8A:
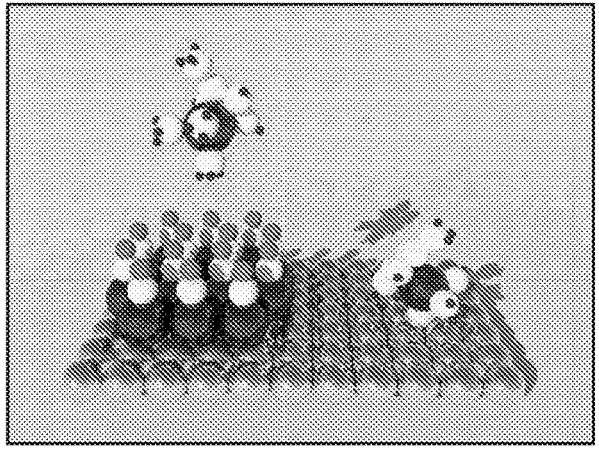
FIG. 8. Schematics of passivation-incorporated atomic layer deposition (a) and normal atomic layer deposition (b) processes compared in a precursor adsorption stage. TEM and energy-filtered TEM (EF-TEM) micrographs of 75 cycles of passivation-incorporated atomic layer deposition (c) and 50 cycles of normal atomic layer deposition (d) on carbon.
Figure 8C:
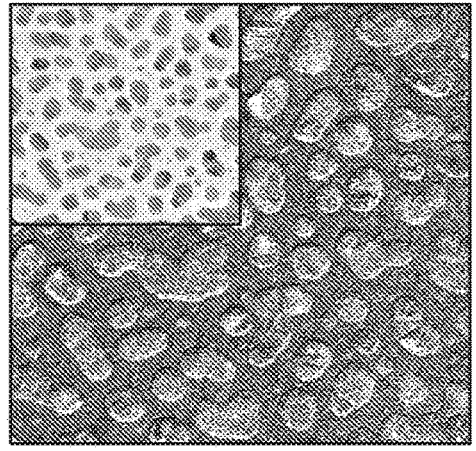
Figure 8B:
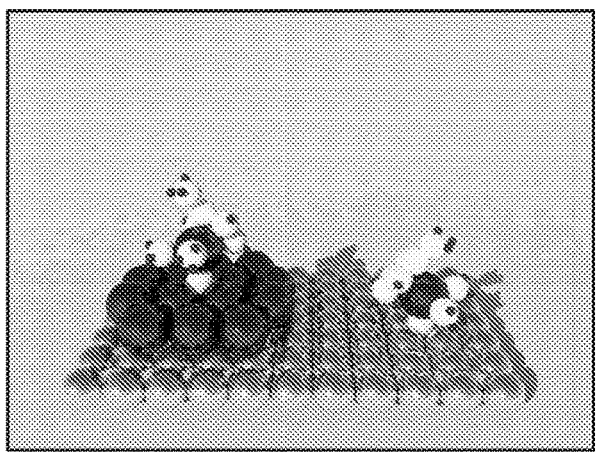
Figure 8D:
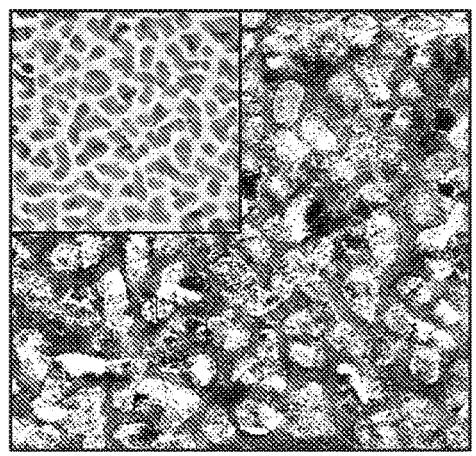

With normal atomic layer deposition (ALD), material growth on a substrate typically undergoes a nucleation phase, where vertical growth and surface coverage compete until the formation of a substantially complete film. This is due to differences in adsorption behaviors of precursors onto a deposited material and the to-be-deposited substrate. As illustrated in FIG. 8a, precursor molecules can adsorb readily on deposits, mostly attributed to van der Waals forces. A strategy to combat nucleation phase and promote precursor coverage on a substrate is to choose the substrate with a higher surface energy so that a surface of the substrate can be effectively wetted. However, this strategy can constrain the choice of substrates. An improved strategy is illustrated in FIG. 8b, where a surface of deposits is modified by adsorbents that passivate the deposit surface to inhibit adsorption of precursors. In this case, carbon monoxide (CO) can be used as a passivation gas for deposition of Pt, as the Pt-containing precursor, (methyl cyclopentadienyl) trimethylplatinum, can have significantly lower adsorption enthalpy (FIG. 6) on CO-adsorbed Pt compared to on bare Pt. The deposition results on a carbon substrate are showcased in FIGS. 8c and 8d. At similar lateral grain sizes, the passivation-incorporated ALD (PALD) process significantly suppressed vertical growth as compared to formation of three-dimensional islands without the CO passivation. The overall growth rate is also lowered with the introduction of passivation gas, indicating the Pt deposition is mostly dominated by vertical growth of Pt islands rather than wetting of the carbon substrate.

Figure 9A:
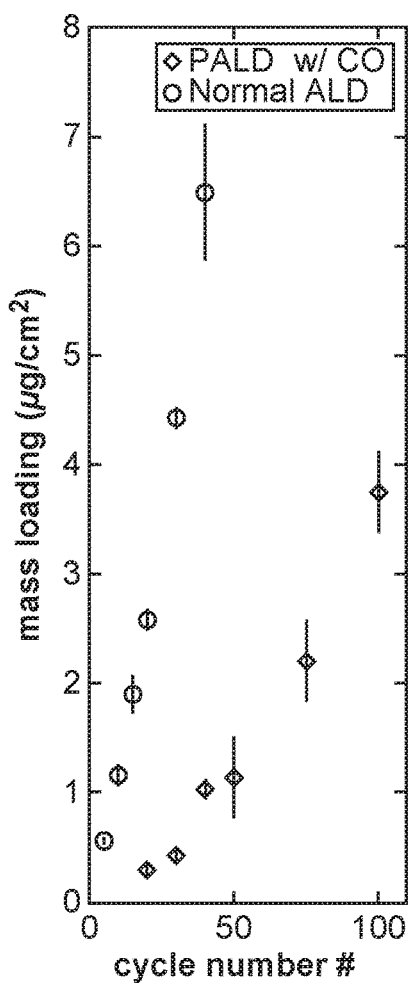
FIG. 9. Mass loading (a) of Pt deposition via normal atomic layer deposition and passivation-incorporated atomic layer deposition as a function of cycle numbers. Mass activity (b), electrochemically active area (c), and specific activity (d) of normal atomic layer deposition and passivation-incorporated atomic layer deposition samples for oxygen reduction reaction as a function of mass loading. Electrochemical potentials corresponding to ½, and ¾ monolayer of hydroxyl group desorption (e) and adsorption (f) estimated by anodic and cathodic part of cyclic voltammetry under Argon saturated electrolyte.
Figure 9B:
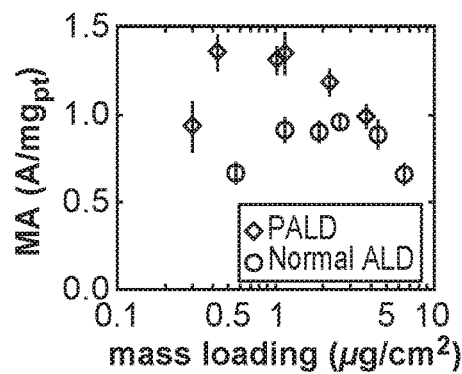
Figure 9C:
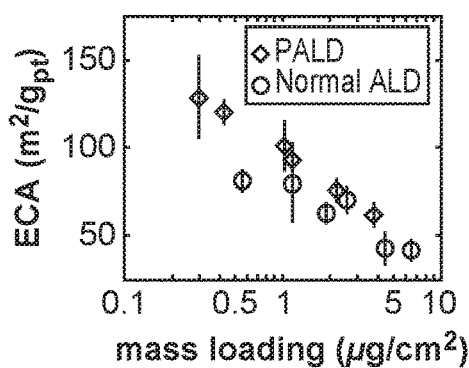
Figure 9D:
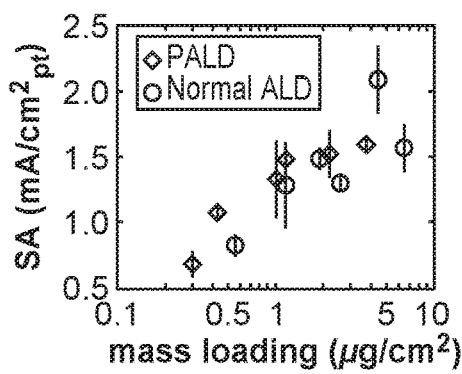
Figure 9E:
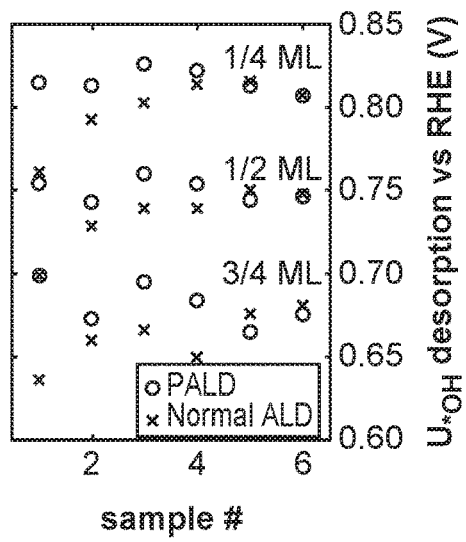
Figure 9F:
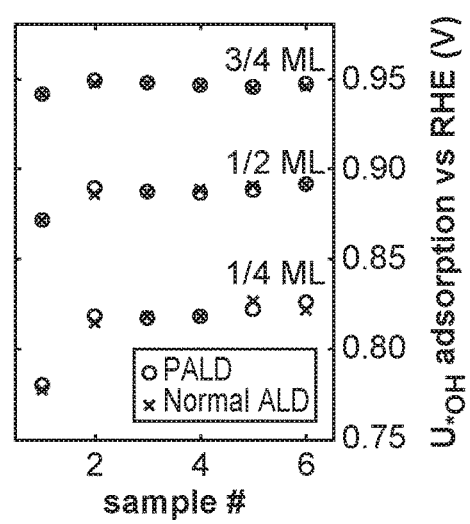
Figure 10:
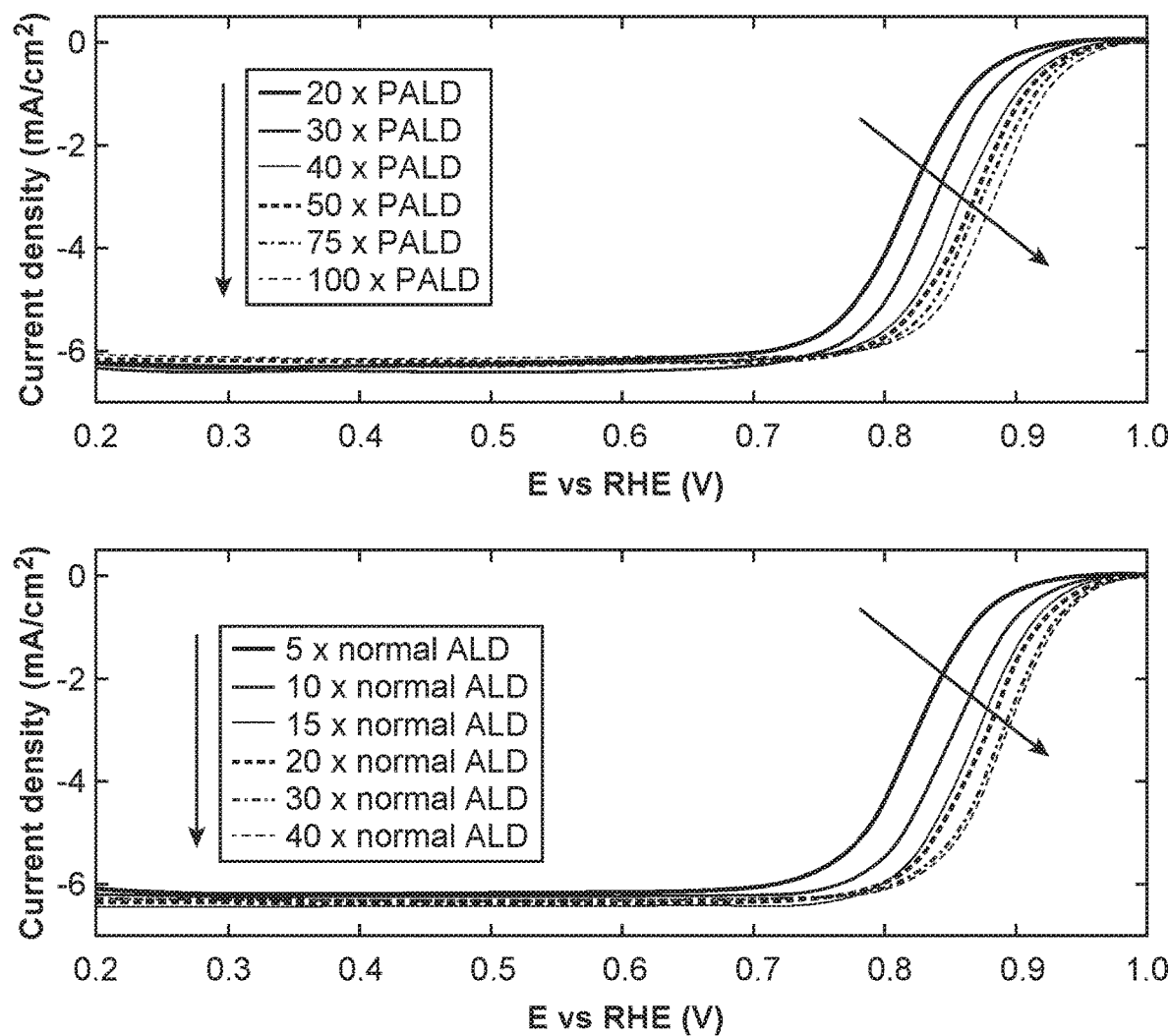
FIG. 10. Oxygen reduction reaction polarization curves of Pt deposited on glassy carbon electrode by passivation-incorporated atomic layer deposition (top) and normal atomic layer deposition (bottom).
Figure 11:
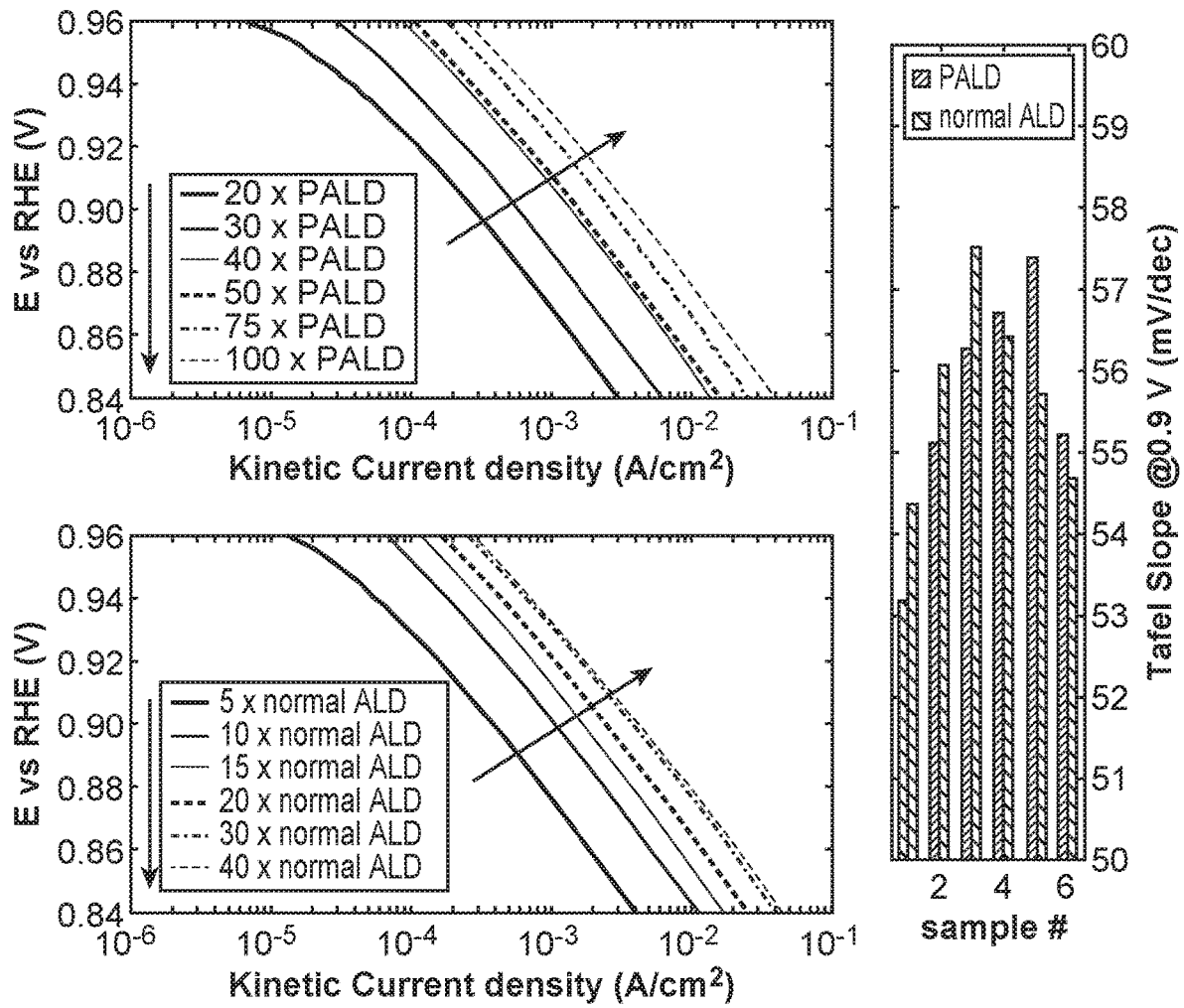
FIG. 11. Tafel plots of Pt deposited on glassy carbon electrodes by passivation-incorporated atomic layer deposition (left top) and normal atomic layer deposition (left bottom) and extracted Tafel slopes (right) at about 0.9 V (vs. reversible hydrogen electrode).
Figure 12:
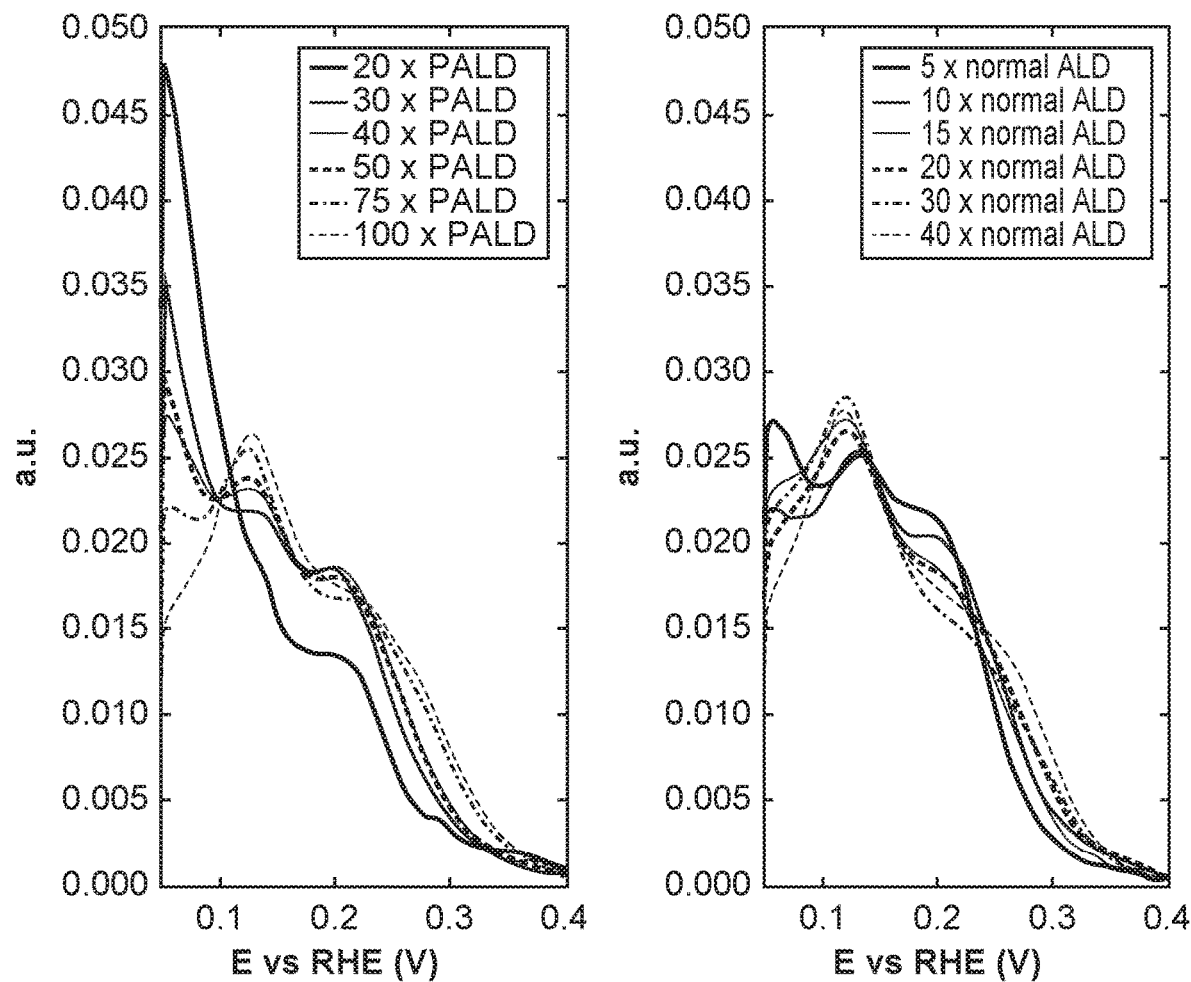
FIG. 12. Hydrogen under potential deposition (HUPD) part of cyclic voltammetry curves (normalized by electrochemically active areas) of Pt deposited on glassy carbon electrodes by passivation-incorporated atomic layer deposition (left) and normal atomic layer deposition (right).
Figure 13:
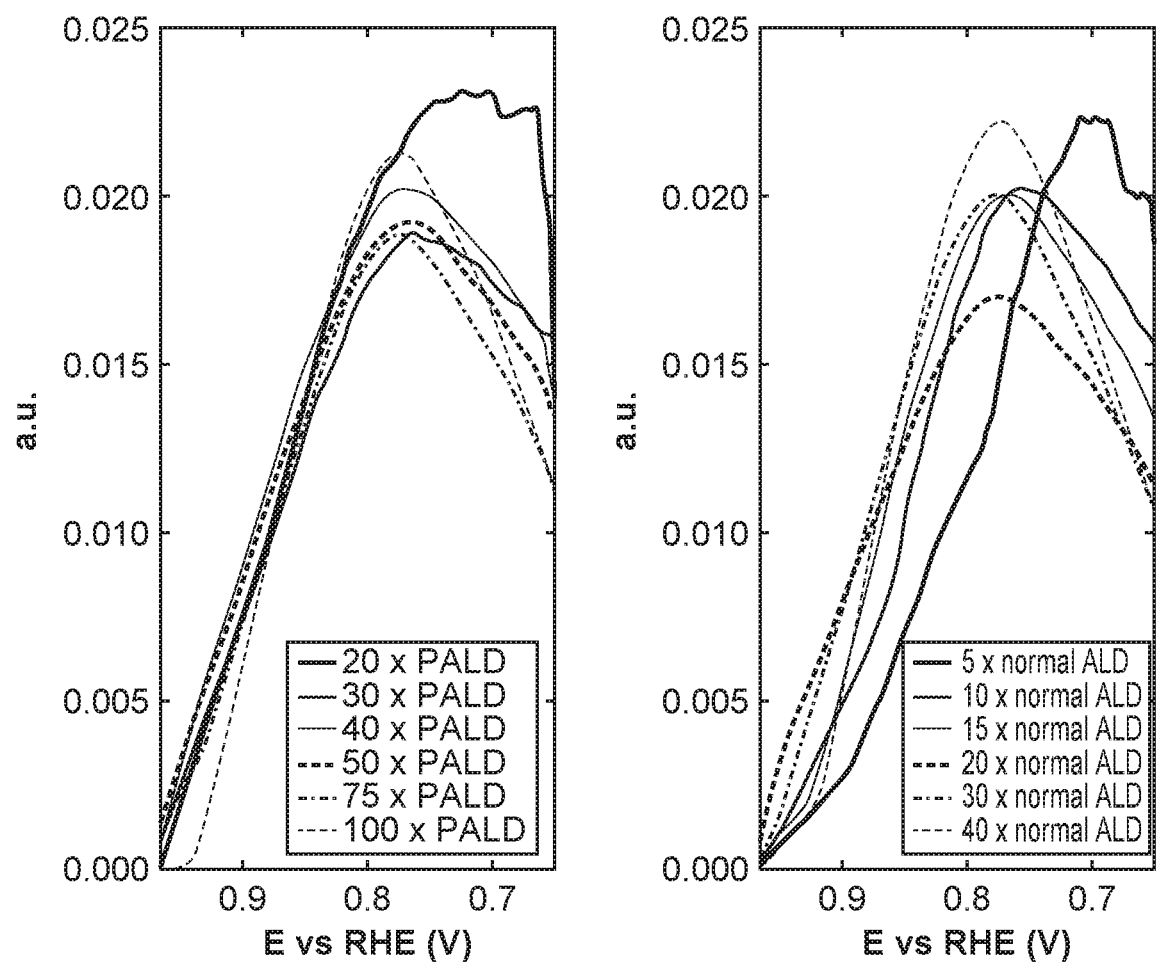
FIG. 13. Oxygen species desorption part of anodic cyclic voltammetry curves (normalized by electrochemically active areas) of Pt deposited on glassy carbon electrodes by passivation-incorporated atomic layer deposition (left) and normal atomic layer deposition (right).
Figure 14:
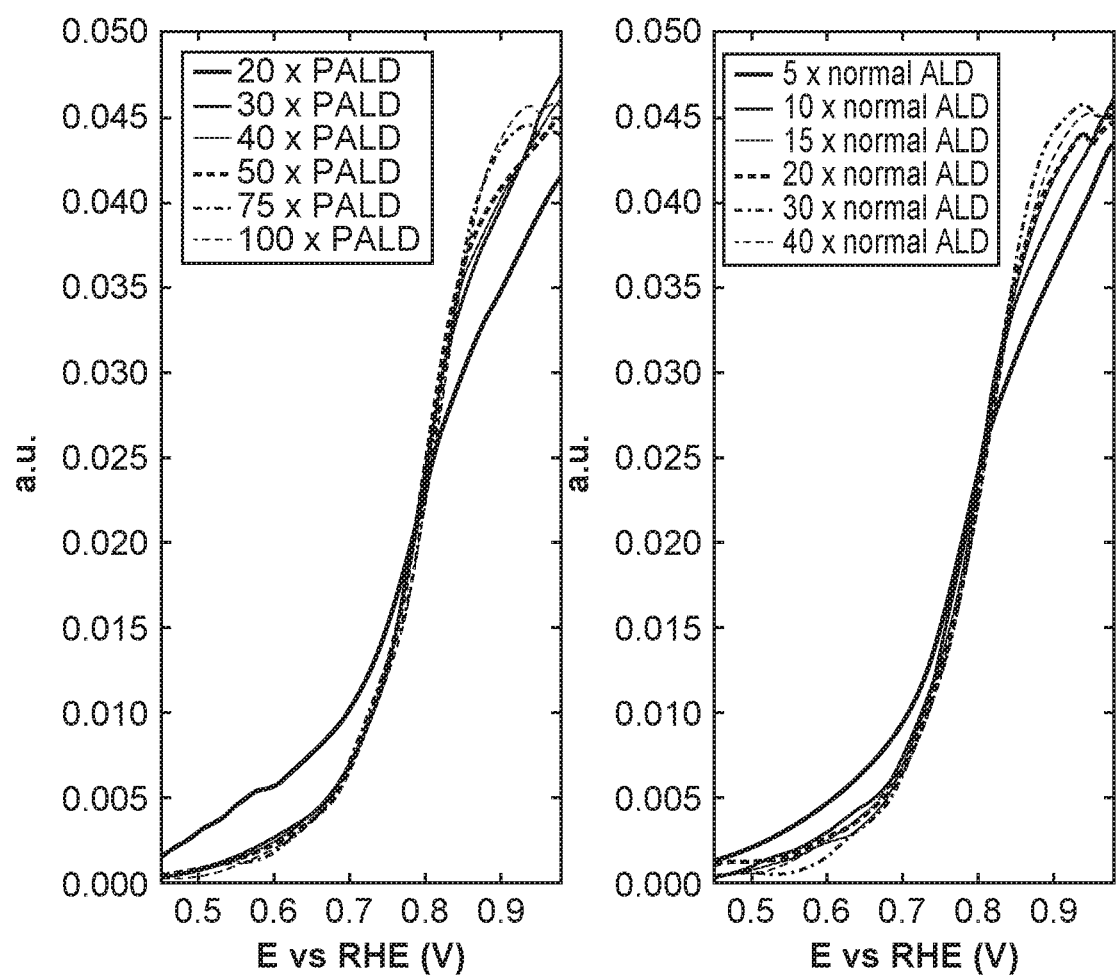
FIG. 14. Oxygen species adsorption part of cathodic cyclic voltammetry curves (normalized by electrochemically active areas) of Pt deposited on glassy carbon electrodes by passivation-incorporated atomic layer deposition (left) and normal atomic layer deposition (right).

To demonstrate the benefits of PALD in forming thin catalysts with high mass activities, Pt was directly deposited by PALD and normal ALD onto glassy carbon electrodes. Deposited onto surfaces with low roughness factors, the catalysts encounter less mass transport impedance as opposed to high surface area carbon. The mass loadings as a function of cycle numbers by normal ALD and PALD are compared in FIG. 9a, with their corresponding mass activity showcased by FIG. 9b. It is evident that PALD slowed the growth of Pt deposits. Despite not completely stopping the Pt growth with higher cycle numbers, incorporation of carbon monoxide decreases growth rate by at least about 5 times. Moreover, the morphological modification of this technique boosts the mass activity of Pt deposits. The advantage of PALD is most significant under a mass loading below about 3 µg/cm², where the mass activity of PALD Pt deposits reaches above about 1.3 A/mg$_{Pt}$ in a 30-50 ALD cycle window and that of normal ALD tops at about 0.9 A/mg$_{Pt}$ in the ALD cycle window of 10-30. For higher number of ALD cycles, the decline of the mass activity converges as mass loading increases and the effect of morphological tuning is less significant with larger sized deposits. Assuming a complete surface average, about 3 µg/cm² can translate to about 2 nm Pt (111) layer, and an actual thickness with a partial coverage can be greater than about 2 nm, leading to a lower portion of active Pt atoms on the surface of deposits. A size effect is at play, where a larger sized deposits can suffer from less efficient Pt atom utilization, and a smaller sized deposit can suffer from strong oxygen binding and lower surface coverage. Nevertheless, a geometry of a deposit would determine its optimal size. As the geometry shifts from three-dimensional dome-shaped particles to a flattened two-dimensional pancake shape, an optimal size can be larger also with a higher optimal mass activity. As explained above, the advantage of PALD is to suppress nucleation on deposited materials so as to confine vertical growth of deposits. With the same total Pt loading, the portion of electrochemically active Pt atoms is higher with PALD. As confirmed by FIG. 9c, Pt deposits with PALD have a larger electrochemically active surface area per mass than those deposited by normal ALD. FIG. 9d further indicates that PALD deposits have slightly higher specific activity below a mass loading of about 3 µg/cm². FIG. 10 compares oxygen reduction reaction polarization curves of Pt deposited on glassy carbon electrode by PALD (top) and normal ALD (bottom). There are no significant differences in Tafel slopes between PALD samples and normal ALD samples (as shown by FIG. 11). A noticeable difference is evident from hydrogen (FIG. 12) and oxygen desorption (FIG. 13) behavior. For oxygen reduction reactions, oxygen desorption plays a more important role than oxygen absorption behavior (FIG. 14). The potentials to desorb and adsorb ¼, ½, and ¾ monolayer of adsorbents from an electrolyte (mostly species including oxygen, a significant portion of which are hydroxyl groups) are compared in FIGS. 9e and 9f, respectively. It is noticeable that the adsorption behavior of PALD and normal ALD Pt deposits are almost the same, while the desorption voltage for PALD samples are significantly higher, indicating oxygenic species can be desorbed more easily. Pt can have stronger oxygen binding energy than optimal, and a weaker oxygen binding is beneficial to oxygen reduction reaction kinetics that can be attributed to the higher specific activity of the PALD samples.

PALD and ALD

ALD of Pt was achieved by alternately exposing the Pt precursor, (methyl cyclopentadienyl)trimethylplatinum (about 99%, Strem Chemicals), and the oxidant, ozone, to target substrates (carbon TEM grid and glassy carbon electrode). Ozone was generated from a mixture of oxygen (about 99.99%) and nitrogen (about 99.998%, with mixing concentration of about 50 parts per million (ppm)) in an ozone generator (MKS Instrument, AX8407-C2). The feeding oxygen flow rate was kept at about 500 standard cubic centimeters per minute (sccm), providing an ozone concentration of about 21.7 wt. %. The Pt precursor was heated at about 80° C. To assure the metallic form of deposited Pt, hydrogen (about 99.999%, Praxair) was introduced in each cycle after the oxidation stage.

PALD was achieved by incorporating a passivation gas soaking operation at the end of each ALD cycle. In this example, carbon monoxide (about 99.5%, Praxair) was fed into an ALD chamber to soak the substrate at about 2 Torr for about 20 seconds at the end of each ALD cycle.

Prior to Pt deposition, the carbon substrates underwent exposure to oxygen plasma in a plasma cleaner (Harrick PDC-001) for about 10 mins for surface functionalization.

Electrochemical Measurements

For oxygen reduction reaction (ORR) activity tests, Pt-coated glassy carbon electrodes were assembled in rotating disk electrode (RDE) tips. An electrolyte was diluted from about 70% perchloric acid (Merck, Suprapur) to about 0.1 mol/L with ultrapure water (about 18.2 MΩ·cm, total organic carbon (TOC)<about 5 parts per billion (ppb)). A three-electrode cell with a platinum wire as a counter electrode and a reversible hydrogen electrode (RHE) as a reference electrode was used. During ORR measurements, the pressure of oxygen was balanced by atmospheric pressure. The measurement temperature was 23±2° C., and the voltammetry was conducted by a Gamry PCI4/300 potentiostat. To reduce contaminants, all glassware was soaked in piranha solution for more than about 24 hours, and rinsed 5 times with ultrapure water prior to use. Before measuring its ORR activity, all electrodes underwent an activation process in argon gas-purged electrolyte with cyclic voltammetry from about 0.025 V to about 1.0 V for about 50 cycles at a scan rate of about 500 mV/s. ORR activity of catalyst-loaded electrode was evaluated by a linear sweep voltammetry at a scan rate of about 20 mV/s from about −0.01 V to about 1 V under an electrode rotation speed of about 1600 rpm. Reported values are corrected for background and uncompensated electrolyte resistance.

Material Characterizations

Mass of Pt was quantified by inductively coupled plasma mass spectrometry (ICP-MS). For Pt on glassy carbon electrodes, backside and side walls of electrodes were first polished prior to soaking into aqua regia. Morphological studies were performed with transmission electron microscopy (TEM).

As used herein, the singular terms "a," "an," and "the" may include plural referents unless the context clearly dictates otherwise. Thus, for example, reference to an object may include multiple objects unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, an object "on" another object can encompass cases where the former object is directly on (e.g., in physical contact with) the latter object, as well as cases where one or more intervening objects are located between the former object and the latter object.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While this disclosure has been described with reference to the specific embodiments thereof, it should be understood by those skilled in the art that various changes may be made and equivalents may be substituted without departing from the true spirit and scope of this disclosure as defined by the appended claims. In addition, many modifications may be made to adapt a particular situation, material, composition of matter, method, operation or operations, to the objective, spirit and scope of this disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of this disclosure. Accordingly, unless specifically indicated herein, the order and grouping of the operations are not a limitation of this disclosure.

What is claimed is:

1. A method comprising:
    (1) performing an atomic layer deposition cycle including
       (a) introducing precursors into a deposition chamber housing a substrate to deposit a material on the substrate, wherein the substrate is carbon, the material is Pt, and the precursors comprise:
          one or more organometallic Pt precursors;
          an oxidative precursor comprising oxygen plasma or ozone introduced after the one or more organometallic Pt precursors; and
          a reductive precursor comprising hydrogen gas or hydrogen plasma introduced after the oxidative precursor; and
       (b) introducing a passivation gas into the deposition chamber wherein the passivation gas is carbon monoxide, and the carbon monoxide adsorbs onto a surface of the Pt; and
    (2) repeating (1) a plurality of times to form a film of Pt, wherein:
       the carbon monoxide adsorbed onto the surface of the Pt forms an intermediate species; and
       the adsorption energy of the one or more organometallic Pt precursors to the intermediate species is greater than an adsorption energy of the one or more organometallic Pt precursors to the substrate,
       wherein the film of Pt has a mass loading of about 0.3 $\mu g/cm^2$ and a mass activity of about 1.0 $A/mg_{Pt}$ to about 1.3 $A/mg_{Pt}$ to about 3 $\mu g/cm^2$.

2. The method of claim 1, wherein a surface coverage of the substrate by the film is at least 30%, and the film has an average thickness in a range from 1 atomic layer to 5 atomic layers.

3. The method of claim 1, wherein the oxidative precursor consists of ozone.

4. The method of claim 1, wherein the reductive precursor consists of hydrogen gas.

5. The method of claim 1, wherein the film has an average thickness in a range from 1 atomic layer to 3 atomic layers.

6. The method of claim 1, wherein the film has an average thickness in a range from 1 atomic layer to 2 atomic layers.

7. The method of claim 1, wherein the film has a surface roughness of no greater than 80% of its average thickness.

* * * * *